(12) United States Patent
McCormack et al.

(10) Patent No.: US 9,474,099 B2
(45) Date of Patent: Oct. 18, 2016

(54) SMART CONNECTORS AND ASSOCIATED COMMUNICATIONS LINKS

(71) Applicant: Keyssa, Inc., Campbell, CA (US)

(72) Inventors: Gary D McCormack, Tigard, OR (US); Ian A Kyles, West Linn, OR (US); Roger D Isaac, San Jose, CA (US)

(73) Assignee: KEYSSA, INC., Mountain View, CA (US)

( * ) Notice: Subject to any disclaimer, the term of this patent is extended or adjusted under 35 U.S.C. 154(b) by 205 days.

(21) Appl. No.: 13/969,565

(22) Filed: Aug. 17, 2013

(65) Prior Publication Data

US 2014/0024314 A1 Jan. 23, 2014

Related U.S. Application Data

(63) Continuation-in-part of application No. 13/657,482, filed on Oct. 22, 2012, and a continuation-in-part of application No. 13/848,735, filed on Mar. 22, 2013, application No. 13/969,565, which is a (Continued)

(51) Int. Cl.
*H04B 7/00* (2006.01)
*H04W 76/04* (2009.01)
(Continued)

(52) U.S. Cl.
CPC ....... *H04W 76/043* (2013.01); *H04W 52/0229* (2013.01); *H04B 1/40* (2013.01);
(Continued)

(58) Field of Classification Search
CPC . H04W 4/008; H04W 76/023; H04W 8/005; H04W 76/02; H04W 12/06; H04W 84/18; H04W 52/0229; H04W 76/028; H04W 88/06; H04W 12/04; H04W 48/16; H04W 4/206; H04W 64/00; H04W 84/12; H04W 84/20; H04W 12/02

USPC .......................................................... 455/41.2
See application file for complete search history.

(56) References Cited

U.S. PATENT DOCUMENTS

| 3,796,831 A | 3/1974 | Bauer |
| 4,485,312 A | 11/1984 | Kusakebe et al. |

(Continued)

FOREIGN PATENT DOCUMENTS

| CN | 1503523 | 6/2004 |
| CN | 102064857 | 5/2011 |

OTHER PUBLICATIONS

International Search Report and Written Opinion of the International Search Authority, PCT/US2013/055487, Jan. 24, 2014.

*Primary Examiner* — Ajibola Akinyemi
(74) *Attorney, Agent, or Firm* — Van Court & Aldridge LLP

(57) ABSTRACT

"Smart" connectors with embedded processors, measurement circuits and control circuits are disclosed for establishing a "contactless" radio frequency (RF) electromagnetic (EM) Extremely High Frequency (EHF) communications link between two electronic devices having host systems. The connectors are capable of monitoring, controlling, and directing (managing) link operation to dynamically adapt to conditions, as well as monitoring and altering (or modifying) data passing through the connector, and selecting a protocol suitable for a communications session. The connectors are capable of identifying the type of content being transferred, providing authentication and security services, and enabling application support for the host systems based on the type of connection or the type of content. The connectors may operate independently of the host systems, and may perform at least one of sensing proximity of a nearby object; detecting a shape of a nearby object; and detecting vibrations.

18 Claims, 2 Drawing Sheets

Related U.S. Application Data continuation-in-part of application No. 13/776,727, filed on Feb. 26, 2013, now Pat. No. 9,219,956, and a continuation-in-part of application No. 13/760,089, filed on Feb. 6, 2013, now Pat. No. 9,191,263, application No. 13/969,565, which is a continuation-in-part of application No. 13/541,543, filed on Jul. 3, 2012, application No. 13/969,565, which is a continuation-in-part of application No. 13/713,564, filed on Dec. 13, 2012, now Pat. No. 8,794,980, application No. 13/969,565, which is a continuation-in-part of application No. 13/524,956, filed on Jun. 15, 2012, now Pat. No. 9,322,904, application No. 13/969,565, which is a continuation-in-part of application No. 13/427,576, filed on Mar. 22, 2012, now Pat. No. 9,373,894, application No. 13/969,565, which is a continuation-in-part of application No. 12/655,041, filed on Dec. 21, 2009, now Pat. No. 8,554,136.

(60) Provisional application No. 61/834,438, filed on Jun. 13, 2013, provisional application No. 61/799,527, filed on Mar. 15, 2013, provisional application No. 61/799,593, filed on Mar. 15, 2013, provisional application No. 61/738,297, filed on Dec. 17, 2012, provisional application No. 61/701,310, filed on Sep. 14, 2012, provisional application No. 61/550,274, filed on Oct. 21, 2011, provisional application No. 61/799,510, filed on Mar. 15, 2013, provisional application No. 61/786,522, filed on Mar. 15, 2013, provisional application No. 61/737,432, filed on Dec. 14, 2012, provisional application No. 61/661,756, filed on Jun. 19, 2012, provisional application No. 61/505,625, filed on Jul. 8, 2011, provisional application No. 61/570,707, filed on Dec. 14, 2011, provisional application No. 61/497,192, filed on Jun. 15, 2011, provisional application No. 61/467,334, filed on Mar. 24, 2011, provisional application No. 61/203,702, filed on Dec. 23, 2008.

(51) Int. Cl.
*H04W 52/02* (2009.01)
*H04B 1/40* (2015.01)
*H04B 5/00* (2006.01)
*H05K 1/02* (2006.01)

(52) U.S. Cl.
CPC .......... *H04B 5/0031* (2013.01); *H05K 1/0243* (2013.01); *H05K 1/0259* (2013.01); *H05K 2201/10098* (2013.01); *Y02B 60/50* (2013.01)

(56) References Cited

U.S. PATENT DOCUMENTS

| | | | |
|---|---|---|---|
| 4,497,068 A | 1/1985 | Fischer | |
| 4,694,504 A | 9/1987 | Porter et al. | |
| 5,543,808 A | 8/1996 | Feigenbaum | |
| 5,621,913 A | 4/1997 | Tuttle et al. | |
| 5,754,948 A | 5/1998 | Metze | |
| 5,773,878 A | 6/1998 | Lim et al. | |
| 5,956,626 A | 9/1999 | Kaschke et al. | |
| 6,175,744 B1* | 1/2001 | Esmailzadeh | H04W 52/24 455/517 |
| 6,351,237 B1 | 2/2002 | Martek et al. | |
| 6,373,447 B1 | 4/2002 | Rostoker et al. | |
| 6,490,443 B1 | 12/2002 | Freeny, Jr. | |
| 6,492,973 B1 | 12/2002 | Kuroki et al. | |
| 6,534,784 B2 | 3/2003 | Eliasson et al. | |
| 6,542,720 B1 | 4/2003 | Tandy | |
| 6,607,136 B1 | 8/2003 | Atsmon et al. | |
| 6,718,163 B2 | 4/2004 | Tandy | |
| 6,915,529 B1 | 7/2005 | Suematsu et al. | |
| 6,967,347 B2 | 11/2005 | Estes et al. | |
| 7,107,019 B2 | 9/2006 | Tandy | |
| 7,311,526 B2 | 12/2007 | Rohrbach et al. | |
| 7,512,395 B2 | 3/2009 | Beukema et al. | |
| 7,517,222 B2 | 4/2009 | Rohrbach et al. | |
| 7,593,708 B2 | 9/2009 | Tandy | |
| 7,598,923 B2 | 10/2009 | Hardacker et al. | |
| 7,612,630 B2 | 11/2009 | Miller | |
| 7,617,342 B2 | 11/2009 | Rofougaran | |
| 7,645,143 B2 | 1/2010 | Rohrbach et al. | |
| 7,656,205 B2 | 2/2010 | Chen et al. | |
| 7,760,045 B2 | 7/2010 | Kawasaki | |
| 7,761,092 B2 | 7/2010 | Desch et al. | |
| 7,768,457 B2 | 8/2010 | Pettus et al. | |
| 7,769,347 B2 | 8/2010 | Louberg et al. | |
| 7,778,621 B2 | 8/2010 | Tandy | |
| 7,791,167 B1 | 9/2010 | Rofougaran | |
| 7,881,675 B1 | 2/2011 | Gazdzinski | |
| 7,889,022 B2 | 2/2011 | Miller | |
| 7,907,924 B2 | 3/2011 | Kawasaki | |
| 7,929,474 B2 | 4/2011 | Pettus et al. | |
| 7,975,079 B2 | 7/2011 | Bennett et al. | |
| 8,014,416 B2 | 9/2011 | Ho et al. | |
| 8,036,629 B2 | 10/2011 | Tandy | |
| 8,041,227 B2 | 10/2011 | Colcombe et al. | |
| 8,060,102 B2 | 11/2011 | Gazzola | |
| 8,087,939 B2 | 1/2012 | Rohrbach et al. | |
| 8,121,542 B2 | 2/2012 | Zack et al. | |
| 8,183,935 B2 | 5/2012 | Milano et al. | |
| 2004/0214621 A1 | 10/2004 | Ponce De Leon et al. | |
| 2005/0109841 A1 | 5/2005 | Ryan et al. | |
| 2005/0140436 A1 | 6/2005 | Ichitsubo et al. | |
| 2006/0038168 A1 | 2/2006 | Estes et al. | |
| 2006/0128372 A1 | 6/2006 | Gazzola | |
| 2006/0159158 A1* | 7/2006 | Moore et al. | 375/130 |
| 2006/0258289 A1 | 11/2006 | Dua | |
| 2007/0024504 A1 | 2/2007 | Matsunaga | |
| 2007/0063056 A1 | 3/2007 | Gaucher et al. | |
| 2007/0141985 A1 | 6/2007 | Parkkinen et al. | |
| 2007/0155329 A1* | 7/2007 | Mehrabanzad | H04B 7/18506 455/63.1 |
| 2007/0229270 A1 | 10/2007 | Rofougaran | |
| 2007/0278632 A1 | 12/2007 | Zhao et al. | |
| 2007/0293193 A1 | 12/2007 | Ramsten et al. | |
| 2008/0089667 A1 | 4/2008 | Grady | |
| 2008/0112101 A1 | 5/2008 | McElwee et al. | |
| 2008/0150799 A1 | 6/2008 | Hemmi et al. | |
| 2008/0159243 A1 | 7/2008 | Rofougaran | |
| 2008/0192726 A1 | 8/2008 | Mahesh et al. | |
| 2008/0195788 A1 | 8/2008 | Tamir et al. | |
| 2008/0290959 A1 | 11/2008 | Ali et al. | |
| 2009/0006677 A1 | 1/2009 | Rofougaran | |
| 2009/0009337 A1 | 1/2009 | Rofougaran | |
| 2009/0037628 A1 | 2/2009 | Rofougaran | |
| 2009/0094506 A1 | 4/2009 | Lakkis | |
| 2009/0098826 A1* | 4/2009 | Zack et al. | 455/41.1 |
| 2009/0175323 A1 | 7/2009 | Chung | |
| 2009/0218407 A1 | 9/2009 | Rofougaran | |
| 2009/0218701 A1 | 9/2009 | Rofougaran | |
| 2009/0236701 A1 | 9/2009 | Sun et al. | |
| 2009/0239392 A1 | 9/2009 | Sumitomo et al. | |
| 2009/0239483 A1 | 9/2009 | Rofougaran | |
| 2009/0245808 A1 | 10/2009 | Rofougaran | |
| 2010/0127804 A1 | 5/2010 | Vouloumanos | |
| 2010/0159829 A1 | 6/2010 | McCormack | |
| 2010/0202499 A1 | 8/2010 | Lee et al. | |
| 2010/0231452 A1 | 9/2010 | Babakhani et al. | |
| 2010/0283700 A1 | 11/2010 | Rajanish et al. | |
| 2010/0285634 A1 | 11/2010 | Rofougaran | |
| 2010/0297954 A1 | 11/2010 | Rofougaran et al. | |
| 2011/0047588 A1 | 2/2011 | Takeuchi et al. | |
| 2011/0077044 A1* | 3/2011 | Sampath | H04W 52/146 455/522 |
| 2011/0092212 A1 | 4/2011 | Kubota | |
| 2011/0181484 A1 | 7/2011 | Pettus et al. | |
| 2011/0207425 A1 | 8/2011 | Juntunen et al. | |
| 2011/0285606 A1 | 11/2011 | De Graauw et al. | |

(56) References Cited

U.S. PATENT DOCUMENTS

| | | |
|---|---|---|
| 2011/0286703 A1 | 11/2011 | Kishimi et al. |
| 2011/0311231 A1 | 12/2011 | Ridgway |
| 2012/0028582 A1 | 2/2012 | Tandy |
| 2012/0064664 A1 | 3/2012 | Yamazaki et al. |
| 2012/0083137 A1 | 4/2012 | Rohrbach et al. |
| 2012/0110635 A1 | 5/2012 | Harvey |
| 2012/0263244 A1 | 10/2012 | Kyles et al. |
| 2012/0286049 A1 | 11/2012 | McCormack et al. |
| 2012/0290760 A1 | 11/2012 | McCormack et al. |
| 2012/0295539 A1 | 11/2012 | McCormack et al. |
| 2012/0307932 A1 | 12/2012 | McCormack et al. |
| 2012/0319496 A1 | 12/2012 | McCormack |
| 2012/0319890 A1 | 12/2012 | McCormack et al. |
| 2013/0070817 A1 | 3/2013 | McCormack et al. |
| 2013/0106673 A1 | 5/2013 | McCormack et al. |
| 2013/0109303 A1 | 5/2013 | McCormack et al. |

* cited by examiner

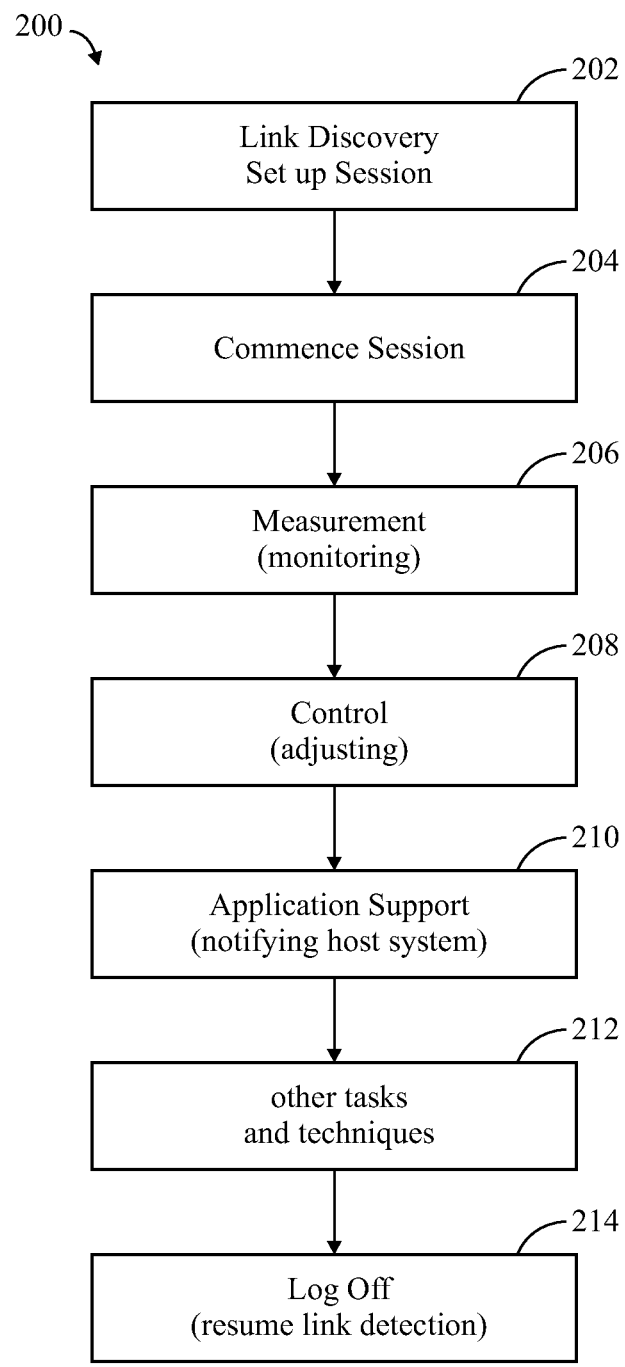

SMART CONNECTORS AND ASSOCIATED COMMUNICATIONS LINKS

CROSS-REFERENCE(S) TO RELATED APPLICATIONS

This application claims priority from the following US applications:
nonprovisional of 61/834,438 filed 13 Jun. 2013
nonprovisional of 61/799,527 filed 15 Mar. 2013
nonprovisional of 61/799,593 filed 15 Mar. 2013
nonprovisional of 61/799,510 filed 15 Mar. 2013
nonprovisional of 61/786,522 filed 15 Mar. 2013
nonprovisional of 61/738,297 filed 17 Dec. 2012
nonprovisional of 61/701,310 filed 14 Dec. 2012
continuation-in-part of 13/848,735 filed 22 Mar. 2013, which claims priority from 61/737,432 filed 14 Dec. 2012
continuation-in-part of 13/776,727 filed 26 Feb. 2013
continuation-in-part of 13/760,089 filed 6 Feb. 2013, which claims priority from 61/661,756 filed 19 Jun. 2012
continuation-in-part of 13/7135,64 filed 13 Dec. 2012, which claims priority from 61/570,707 filed 14 Dec. 2011
continuation-in-part of 13/657,482 filed 22 Oct. 2012, which claims priority from 61/550,274 filed 20 Oct. 2011
continuation-in-part of 13/541,543 filed 3 Jul. 2012, which claims priority from 61/504,625 filed 5 Jul. 2011
 continuation-in-part of 13/524,956 filed 15 Jun. 2012, which claims priority from 61/497,192 filed 15 Jun. 2011
continuation-in-part of 13/427,576 filed 22 Mar. 2012, which claims priority from 61/467,334 filed 24 Mar. 2011
continuation-in-part of 12/655,041 filed 21 Dec. 2009, which claims priority from 61/203,702 filed 23 Dec. 2008

TECHNICAL FIELD

This disclosure relates broadly to connecting electronic devices with one another and operating a communications link between the devices, and also relates to systems incorporating said techniques.

BACKGROUND

It is often important to "connect" electronic devices together, establishing a communications link between the electronic devices, such as for transferring data between the devices, or simply communicating between the two devices. Exemplary data being transferred between devices may comprise a media file (such as an image file, an audio file, a video file), DRM (digital rights management) protected content, an OS (operating system) update, customer specific code, OEM (original equipment manufacturer) specific code, retail specific code, a firmware image for the destination device, user data, encryption/decryption keys (codes), electronic funds transfer (EFT) data, static data and the like.

In the descriptions set forth herein, one of the devices participating in a communications link may be referred to as a "source" (or sending) device, and the other device may be referred to as a "destination" (or receiving) device. However, it should be understood that data may be transferred in either, or both directions between the two devices.

Some examples of electronic devices which may benefit from the techniques disclosed herein may include cellphones (or handsets, or smart phones), computers, laptops, tablets, or comparable electronic device, to name but a few.

Typically, the communications link between two devices comprises a cabled connection or a wireless connection. A cabled connection such as USB (Universal Serial Bus) is typically point-to-point, and requires mechanical connectors at each device, and a cable between the devices (one of which devices may be a "hub" connecting point-to-point with several other USB-enabled devices). A wireless connection such as WiFi or Bluetooth operates in more of a "broadcast" mode, where one device can communicate simultaneously with several other devices, over a RF (radio frequency) link, typically in the range of 700 MHz-5.8 GHz.

In the main hereinafter, point-to-point connection-oriented techniques for data transfer between two electronic devices will be discussed. An illustrative example of a point-to-point, connection-oriented communications link for transferring data between electronic devices is Near Field Communication (NFC). NFC implements a set of standards for smartphones and similar devices to establish radio frequency (RF) communication with each other by touching ("bumping") them together or bringing them into close proximity with one another.

Current mechanical connectors are "passive", and therefore offer no additional features and capabilities with respect to the state of the connection. Generally, either the connection is working, or not. The host system behind the connector may perform some initial analysis (including detection and enumeration of connected devices) in setting up the communications link, which may be time-consuming process and, generally, after the link is established, no more testing is performed, the link simply operates, until it fails. After link failure, a host system may be programmed to attempt to re-establish the connection, which can be a cumbersome process.

SUMMARY

It is a general object of the invention to provide improved techniques for communicating between electronic devices, which may include techniques for establishing, initiating, setting up, monitoring, maintaining, adapting and dynamically altering the communication links, and which may include improved techniques for alleviating overhead on the host system.

These and other objects may generally be achieved by eliminating mechanical connectors and cable wires, using instead "contactless" (electromagnetic, rather than electrical) connectors and an electromagnetic (EM) communications link (interface). The contactless connectors may constitute a communication subsystem associated with a host system of a device, and may comprise transceivers (and associated transducers or antennas) for converting between electrical signals (for the host system) and electromagnetic (EM) signals (for the contactless communications link).

Data transfers between electronic devices may be implemented over a "contactless" radio frequency (RF) electromagnetic (EM) Extremely High Frequency (EHF) communications link (interface) which is handled substantially entirely by the contactless connectors of the devices involved in the data transfer. (The electronic devices may be referred to hereinafter simply as "devices". The contactless RF EHF communications link may be referred to hereinafter simply as "contactless communications link" or "contactless link", or "contactless connection", or simply "connection". Communication between devices over the connection may be referred to as a "communication session".)

In the main hereinafter, "contactless" radio frequency (RF) electromagnetic (EM) communications links between devices having contactless connectors will be discussed. However, it should be understood that some of the techniques disclosed herein may have applicability to some cabled connections using mechanical connectors, as well as to some wireless connections using RF (other than at EHF), typically in a long-range broadcast, rather than short-range, closely-coupled, point-to-point communications mode.

According to the invention, generally, electronic devices (or simply "devices") may comprise a host system and "smart" contactless connector for setting up and managing a contactless data link. As used herein, a "smart" contactless connector associated with a device may comprise:
an electrical interface for interfacing with a host system of the device,
a processor and associated memory,
control circuits for altering data passing through the connector,
measurement circuits monitoring the health of the connection, and the data being sent,
one or more transceivers for sending signals to and receiving signals from transceiver(s) of another "smart" contactless connector associated with another (partner) device.

According to an embodiment or example of the invention, a method of operating a contactless communications link with a contactless connector associated with an electronic device may be characterized by:
  at least one of the connectors is capable of performing at least one of:
  (i) controlling operation of the communications link;
  (ii) monitoring data passing through the connector;
  (iii) monitoring operation of the communication link; and
  (iv) providing application support to a host system of the electronic device.

The contactless connector may be capable of performing at least one of:
  determining a quality of the communications link;
  reacting to a quality of the communications link;
  detecting another contactless connector on the communications link;
  determining a connection state for the communications link;
  verifying a proper connection for the communications link;
  providing security for a communication session on the communications link;
  determining if a connection failure is imminent;
  providing connection strength telemetry;
  detecting an onset of a communications link; and
  providing information about a quality of the communications link;

The contactless connector may be further capable of determining a protocol for a communication session with another contactless connector based on at least one of:
  information about a device associated with the other contactless connector;
  the type of data being transferred over the communications link;
  information about the communications link; and
  information or requirements relevant to implementing an effective communication session between the devices associated with the contactless connectors.

The contactless connector may be further capable of performing at least one of:
  determining a type of data passing through the connector;
  providing authentication for data passing through the connector;
  altering data passing through the connector;
  digitally watermarking data passing through the connector;
  signature detection and stamping of data passing through the connector;
  applying obfuscation algorithms to data passing through the connector; and
  applying steganography to data passing through the connector;
  at a device at one end of a communications link, modifying data being transferred based on a characteristic of a another device on the communications link; and
  preventing certain types of data from passing through the connector.

The contactless connector may be further capable of performing at least one of:
  tracking and logging data passing through the connector; and
  tracking and logging characteristics of the contactless connection.

The contactless connector may be further capable of performing at least one of:
  waking up the host system;
  initiating actions in the host system;
  using time of flight or signal strength as a hash in an encryption table;
  performing application support based on at least one of the type of connection, the operational state of the link, and the type of content passing over the link;
  storing information associated with the type of connection or type of content being sent over the link; and
  providing interrupts to the host system based on the presence of the connection or specific qualities of the connection.

The contactless connector may be further capable of performing at least one of:
  implementing at least one of metering, quotas, speed/power scaling, multi-channel control, lock and key algorithms; and
  transferring data over the contactless connection without intervention from the host system.

The contactless connector may be further capable of performing at least one of:
  performing proximity sensing;
  detecting a shape of a nearby object;
  detecting a shape of a partner electronic device; and
  detecting vibrations.

The contactless connector may further comprise a transceiver and may further be capable of performing at least one of:
  operating the transceiver in a reduced-power state and powering the transceiver up when a link is detected; and
  dynamically controlling transceiver power output to achieve at least one of minimizing power usage, maximizing data transfer rate, meeting emission requirements based on connection type, adjusting power output to improve quality of the connection, and meeting emission requirements in different geographic locations.

The device associated with the contactless connector may be enclosed in a non-conducting barrier; and material may be disposed around at least a portion of the communications link to protect data being transferred from snooping.

According to an embodiment or example of the invention, a contactless connector may be associated with an electronic device comprising a host system, and the contactless connector may comprise means for establishing a contactless connection with another contactless connector associated with another electronic device by at least one of sending and receiving data in the form of extremely high frequency (EHF) signals over a contactless communications link, the contactless connector comprising an electrical interface for interfacing with the host system of the device, characterized by the contactless connector being capable of at least one of:
  managing the contactless connection;
  monitoring data passing over the communications link; and
  providing application support for the host system.

The contactless connector may further comprise at least one of:
  a processor and associated memory;
  control circuits for altering data passing through the contactless connector; and
  measurement circuits for monitoring the connection and the data being sent over the link.

The contactless connector may be capable of at least one of:
  determining a quality of the communications link;
  controlling operation of the communications link;
  reacting to conditions of the communications link; and
  modifying the communications link.

The contactless connector may be capable of at least one of:
  determining a type of data passing over the communications link;
  appending to data passing over the communications link; and
  changing data passing over the communications link.

The contactless connector may be capable of at least one of:
  initiating actions in the host system;
  waking up the host system; and
  interfacing with the host system.

According to an embodiment or example of the invention, a method of communicating between electronic devices may comprise:
  at a first electronic device, with a first contactless connector translating a data signal from a first electrical interface to a modulated carrier signal and transmitting the modulated carrier signal over a contactless communications link to a second electronic device with a second contactless connector capable of translating the modulated carrier to a base signal on a second electrical interface, wherein the electrical interfaces are configured to communicate differential signals with their respective host systems;
  and may be characterized in that at least one of the connectors is capable of performing at least one of:
    (i) controlling operation of the communications link;
    (ii) monitoring data passing through the connector onto the communications link; and
    (iii) providing application support to the host system of the electronic device.

At least one of the connectors may be further capable of performing at least one of:
  determining a quality of the communications link;
  reacting to a quality of the communications link;
  detecting another contactless connector on the communications link;
  determining a connection state for the communications link;
  verifying a proper connection for the communications link;
  providing security for a communication session on the communications link;
  determining if a connection failure is imminent;
  providing connection strength telemetry;
  detecting an onset of a communications link; and
  providing information about a quality of the communications link;

At least one of the connectors may be further capable of determining a protocol for a communication session between the contactless connectors (106, 126) based on at least one of:
  information about a device (122) associated with the other contactless connector (126);
  the type of data being transferred over the communications link;
  information about the communications link; and
  information or requirements that may be relevant to implementing an effective communication session between devices associated with the contactless connectors.

At least one of the connectors may be further capable of performing at least one of:
  determining a type of data passing through the connector;
  providing authentication for data passing through the connector;
  altering data passing through the connector;
  digitally watermarking data passing through the connector;
  signature detection and stamping of data passing through the connector;
  applying obfuscation algorithms to data passing through the connector; and
  applying steganography to data passing through the connector;
  at a device at one end of a communications link, modifying data being transferred based on a characteristic of a device at the other end of the link;
  preventing certain types of data from passing through the connector.
  tracking and logging data passing through the connector; and
  tracking and logging characteristics of the contactless connection.

At least one of the connectors may be further capable of performing at least one of:
  waking up the host system;
  initiating actions in the host system;
  using time of flight or signal strength as a hash in an encryption table;
  performing application support based on the type of connection or the type of content passing over the link;
  storing information associated with the type of connection or type of content being sent over the link; and
  providing interrupts to the host system based on the presence of the connection or specific qualities of the connection.

According to an embodiment or example of the invention, a system for transferring data between a first device and a second device, over a contactless communications link controlled by communication subsystems that operate independently of a host system within each device may be characterized by:
  processors and circuits within the subsystems for performing at least one of:
    means for managing a connection on the communications link;
    means for monitoring data passing over the communications link; and
    means for providing application support for the host system.

The contactless link may comprise EHF carrier passing through at least one dielectric medium.

A dielectric coupler may be disposed in the communications link.

A non-conducting barrier may enclose at least one of the first and second devices.

Shielding material may cover at least one of at least a portion of a transmission path between the two electronic devices and a transceiver of at least one of the devices; and the shielding material may be able to degrade an extremely high frequency (EHF) signal passing through the material.

According to an embodiment or example of the invention, in an electronic device comprising a chip having a transceiver operating at extremely high frequency (EHF), at least one of the following methods may be performed:

sensing proximity of a nearby object, which may be a partner electronic device.;

detecting a shape of a nearby object; and detecting vibrations.

The transfer of data between devices enabled by the "smart" connectors disclosed herein is very user-friendly, requiring little or no user interaction or direction to perform. Generally, proximity of the two devices may be all that is required to initiate and perform data transfers.

Some benefits or advantages of the techniques disclosed herein may include one or more of the following:

the connection can be managed by the contactless connectors data being transferred can be monitored by the contactless connectors the contactless connectors can provide application support to the host system in a contactless deployment, no physical connection (cable and mechanical connectors) is needed between two devices involved in a data transfer The invention(s) described herein may relate to industrial and commercial industries, such as electronics and communications industries using devices that communicate with other devices or devices having communication between components in the devices.

Other objects, features and advantages of the invention(s) disclosed herein may become apparent in light of the following illustrations and descriptions thereof.

BRIEF DESCRIPTION OF THE DRAWINGS

Reference will be made in detail to embodiments of the disclosure, non-limiting examples of which may be illustrated in the accompanying drawing figures (FIGS). The figures may be in the form of diagrams. Some elements in the figures may be exaggerated or drawn not-to-scale; others may be omitted, for illustrative clarity. Any text (legends, notes, reference numerals and the like) appearing on the drawings are incorporated by reference herein. When terms such as "left" and "right", "top" and "bottom", "upper" and "lower", "inner" and "outer", or similar terms are used in the description, they may be used to guide the reader to orientations of elements in the figures, but should be understood not to limit the apparatus being described to any particular configuration or orientation, unless otherwise specified or evident from context. Different "versions" of elements may be referenced by reference numerals having the same numbers (###) followed by a different letter suffix (such as "A", "B", "C", or the like), in which case the similar elements may be inclusively referred to by the numeric portion (###) only of the reference numeral. With regard to circuit diagrams, some connections between elements which are shown may be described only briefly, and some connections between elements may be omitted, for illustrative clarity.

FIG. 2 is diagram (or flowchart) illustrating some methods of operation for the devices having "smart" contactless connectors and communicating over the contactless link.

DETAILED DESCRIPTION

Figure 1:
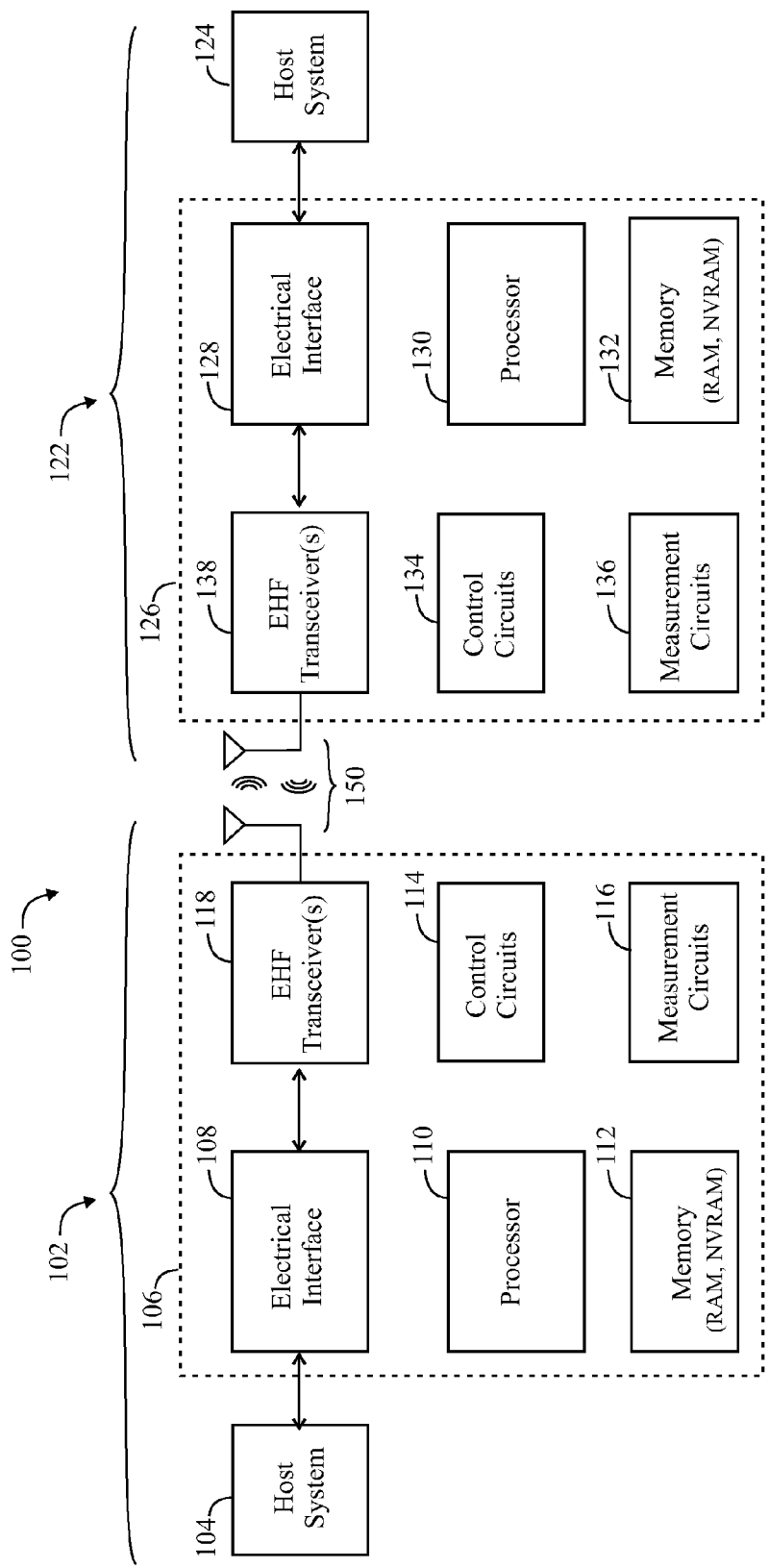
FIG. 1 is a diagram illustrating two exemplary electronic devices, each having a "smart" contactless connector associated therewith, and communicating over a contactless link with one another.

Various embodiments (or examples) may be described to illustrate teachings of the invention(s), and should be construed as illustrative rather than limiting. It should be understood that it is not intended to limit the invention(s) to these particular embodiments. It should be understood that some individual features of various embodiments may be combined in different ways than shown, with one another. Reference herein to "one embodiment", "an embodiment", or similar formulations, may mean that a particular feature, structure, operation, or characteristic described in connection with the embodiment is included in at least one embodiment of the present invention.

The embodiments and aspects thereof may be described and illustrated in conjunction with systems, devices and methods which are meant to be exemplary and illustrative, not limiting in scope. Specific configurations and details may be set forth in order to provide an understanding of the invention(s). However, it should be apparent to one skilled in the art that the invention(s) may be practiced without some of the specific details being presented herein. Furthermore, some well-known steps or components may be described only generally, or even omitted, for the sake of illustrative clarity.

In the following descriptions, some specific details may be set forth in order to provide an understanding of the invention(s) disclosed herein. It should be apparent to those skilled in the art that these invention(s) may be practiced without these specific details. Headings (typically underlined) may be provided as an aid to the reader, and should not be construed as limiting.

Some Terminology

The following terms may be used in the descriptions set forth herein, and should be given their ordinary meanings unless otherwise explicitly stated or as may be evident from context.

The acronym "EHF" stands for Extremely High Frequency, and refers to a portion of the electromagnetic (EM) spectrum in the range of 30 GHz to 300 GHz (gigahertz).

The term "transceiver" (which may be abbreviated "XCVR", or "Tx/Rx") may refer to a device such as an IC (integrated circuit) including a transmitter ("Tx") and a receiver ("Rx") so that that the integrated circuit may be used to both transmit and receive information (data). Generally, a transceiver may be operable in a half-duplex mode (alternating between transmitting and receiving), or in a full-duplex mode (transmitting and receiving simultaneously), or configured as either a transmitter or a receiver (simplex mode).

The term "contactless", as used herein, refers to implementing electromagnetic (EM) rather than electrical (wired, contact-based) connections and transport of signals between entities (such as devices). In some of the literature, the term "wireless" is used to convey this meaning. As used herein, the term "contactless" may refer to a carrier-assisted, dielectric coupling system which may have an optimal range in the zero to five centimeter range. The connection may be validated by proximity of one device to a second device. Multiple contactless transmitters and receivers may occupy a small volume of space. A contactless link established with electromagnetics (EM) may be point-to-point, in contrast with a wireless link which typically broadcasts to several points.

The terms, chip, die, integrated circuit (IC), semiconductor device, and microelectronic device, are often used interchangeably, in common usage, and may be used interchangeably herein. This also may include bare chips (or dies), packaged chips (or dies), and chip modules and packages. The techniques disclosed herein may be implemented with integrated circuits (ICs) using standard CMOS (Complementary-Metal-Oxide-Semiconductor) processes. Some functions described as being implemented by chips may be implemented as macro-functions incorporated into application specific integrated circuits (ASICS) and the like, and may alternatively be implemented, at least partially, by software running on a microcontroller. With respect to chips, various signals may be coupled between them and other circuit elements via physical, electrically-conductive connections. Such a point of connection is may be referred to as an input, output, input/output (I/O), terminal, line, pin, pad, port, interface, or similar variants and combinations.

Connector-Replacement Chips

US 20100159829 (the '829 publication), incorporated in its entirety by reference herein, discloses tightly-coupled near-field communication-link devices, referred to therein as "connector-replacement chips". Tightly-coupled near-field transmitter/receiver pairs are deployed such that the transmitter is disposed at a terminal portion of a first conduction path, the receiver is disposed at a terminal portion of a second conduction path, the transmitter and receiver are disposed in close proximity to each other, and the first conduction path and the second conduction path are discontiguous with respect to each other. In this manner, methods and apparatus are provided for transferring data through a physically discontiguous signal conduction path without the physical size and signal degradation introduced by a signal-carrying mechanical connector, and associated cabling.

The '829 publication shows (FIG. 4 therein) a high-level schematic representation of an illustrative embodiment of a near-field transmitter/receiver pair. The transmitter and receiver are not physically touching, but are spaced in proximity to each other such that near-field coupling between them is obtained. The near-field transmitter/receiver pair provides an ultra-miniaturized high-capacity communications link. An EHF carrier enables tiny antennas and very large bandwidth capacity. Additionally, signal equalization and termination management may be integrated on the same chip with the near-field transmitter, receiver, and/or transceiver.

As further disclosed in the '829 publication,

Generally, embodiments of the present invention provide methods and apparatus for transferring data through a physically discontiguous signal conduction path without the physical size and signal degradation introduced by a signal-carrying mechanical connector, and without the associated costs and power consumption of equalization circuits. Various embodiments of the present invention provide data transfer between physically discontiguous portions of a signal conduction path by means of near-field coupling apparatus which have tightly-linked transmitter and receiver pairs. These transmitters and receivers are typically implemented as integrated circuits. Antennas for these may be internal or external with respect to the integrated circuits.

In some embodiments of the present invention, the transmitter/receiver pair includes a first chip with a transmitter and a second chip with a receiver; while in other embodiments the transmitter/receiver pair includes a first chip with one or more transceivers, and a second chip with one or more transceivers.

In some embodiments, the signal conduction path is single-ended, whereas in other embodiments the signal conduction path includes a differential pair.

As further disclosed in the '829 publication, an electronic product may comprise:
 a first substrate with a first conduction path disposed thereon;
 a second substrate with a second conduction path disposed thereon;
 a first near-field transmitter disposed on the first substrate and connected to the first conduction path, the first near-field transmitter operable to transmit a first carrier signal at a first transmit carrier frequency; and
 a first near-field receiver disposed on the second substrate and connected to the second conduction path, the first near-field receiver operable to near-field couple with the first near-field transmitter at the first transmit carrier frequency;
 wherein the first substrate and the second substrate are spaced apart relative to each other such that the first near-field transmitter and the first near-field receiver are disposed within a near-field coupling distance of each other at the first transmitter carrier frequency,
 wherein the first transmitter carrier frequency is in the EHF range,
 wherein the first near-field transmitter is operable to translate a data signal from the first conduction path to a modulated carrier and the first near-field receiver is operable to translate the modulated carrier to a baseband signal on the second conduction path, and
 wherein at least one of the first and second conduction paths comprise at least one pair of conductors configured to communicate at least one differential signal.

US 20120263244 (the '244 publication), incorporated in its entirety by reference herein, discloses integrated circuit with electromagnetic communication. A system for transmitting or receiving signals may include an integrated circuit (IC), a transducer operatively coupled to the IC for converting between electrical signals and electromagnetic signals, and insulating material that fixes the locations of the transducer and IC in spaced relationship relative to each other.

U.S. Pat. No. 13/713,564 (the '564 application), incorporated in its entirety by reference herein, discloses connectors providing haptic feedback. As mentioned therein, it is important to provide improved signal security and integrity when communicating between any two EHF communication units. One method for enhancing or ensuring proper signal security and integrity is to verify that a second EHF communication unit is within a predetermined range before or during a communication attempt with a first EHF communication unit. To that end, systems and methods for detecting the presence of the second EHF communication unit and/or for ensuring another device or surface is within a certain distance may be included. Examples of such systems and methods are described in US 20120319496.

US 20120319496 (the '496 publication), incorporated in its entirety by reference herein, discloses a system for sensing proximity using EHF signals may include a communication circuit configured to transmit via a transducer an EM signal at an EHF frequency, and a proximity sensing circuit configured to sense a nearby transducer field-modifying object by detecting characteristics of a signal within the communication circuit. Some exemplary proximity-sensing circuits are disclosed therein, and the proximity of a nearby object may be detected by a change in the effective impedance of an antenna caused by the nearby object.

US 20120295539 (the '539 publication), incorporated in its entirety by reference herein, discloses EHF communication with electrical isolation and with dielectric transmission medium. A communication system including two transceivers is disclosed therein. A transceiver operating in a transmit mode may include an amplifier that receives a transmit baseband signal and amplifies the signal for input to a modulator which may apply the baseband signal to an EHF carrier signal produced by an EHF oscillator to produce a transmit electrical EHF signal that is communicated to an antenna for transmission. When the transceiver is functioning in a receive mode, an EHF signal received by an antenna and converted to an electrical signal for input to a demodulator for producing a baseband signal. The communication system disclosed uses a modulated EHF carrier to couple signals across an air or dielectric medium. A very high data rate may be realized using this technique.

U.S. Pat. No. 13/848,735, (the '735 application), incorporated in its entirety by reference herein, discloses CONTACTLESS DATA TRANSFER SYSTEMS AND METHODS. Data may be transferred from a communication subsystem of a first device to a communication subsystem of a second device contactlessly, at high speed, and without intervention by host processors of either device. Devices may be programmed or personalized at the factory or warehouse, and may personalized at a warehouse or at a point of sale while in the box. Various modes of operation and use scenarios are described. Portions of the devices themselves, or a transmission path between the devices may be shielded against snooping by a material which degrades an EHF signal passing therethrough.

As disclosed in the '735 application, electronic devices (or simply "devices") may comprise a host system and an I/O (input/output) or communication subsystem. The host system may comprise a host processor and "primary" storage. The I/O subsystem may comprise a controller, "exchange" storage, and an RF (radio frequency) portion comprising at least one of a transmitter (Tx) or receiver (Rx), or at least one transceiver (Tx/Rx). The host processor may function as the communication subsystem controller. The primary and exchange storages may be different portions of one storage.

As disclosed in the '735 application, data transfers between electronic devices may be implemented over a "contactless" radio frequency (RF) electromagnetic (EM) Extremely High Frequency (EHF) communications link (interface), which is handled substantially entirely by the communication subsystems of the devices involved in the data transfer.

As disclosed in the '735 application, data to be transferred may be stored (temporarily) in an "exchange" storage of (or associated with) the communication subsystem of a source (sending) device, awaiting detection (by the source device) of a destination (receiving) device. The host system of the sending device may be OFF, or in a low-power mode. Upon detection of a destination device, a communications link may be established and the data may be transferred to an "exchange" storage of the communication subsystem of the destination (receiving) device where it may be stored (temporarily). The host system of the receiving device may be OFF, or in a low-power mode. Data in the exchange storages of the sending and receiving devices may be firewalled, to protect the host system from malicious code in the data being transferred. The communication subsystem of the receiving device may notify the host system of the receiving device (and may also notify the communication subsystem of the sending device) when the data transfer operation is complete. When the receiving device is turned ON, data from its "exchange" storage may be moved (or copied) to its primary storage. Data may be also transferred in a similar manner from the receiving device to the sending device.

U.S. Pat. No. 13/760,089, (the '089 application), incorporated in its entirety by reference herein, discloses CONTACTLESS REPLACEMENT FOR CABLED STANDARDS-BASED INTERFACES. A contactless, electromagnetic (EM) replacement (substitute, alternative) for cabled (electric) Standards-based interfaces (such as, but not limited to USB) which effectively handles the data transfer requirements (such as bandwidth, speed, latency) associated with the Standard, and which is also capable of measuring and replicating relevant physical conditions (such as voltage levels) on data lines so as to function compatibly and transparently with the Standard. A contactless link may be provided between devices having transceivers. A non-conducting housing may enclose the devices. Some applications for the contactless (EM) interface are disclosed. A dielectric coupler facilitating communication between communications chips which are several meters apart is disclosed. Conductive paths may provide power and ground for bus-powered devices.

Link Discovery

As disclosed in the '735 application, the process of a first device (notably its communication subsystem) detecting a second device (notably its communication subsystems) and establishing a contactless link may be referred to generally as "link discovery".

As disclosed in the '735 application, in point-to-point wireless (contactless) systems, it is necessary to determine when to initiate a link between two devices. In traditional connector-based systems, the link establishment can be determined based on measuring some electrical characteristics that change when a connector is plugged in and a link between two devices may be established. In a point-to-point contactless system, an electrical detection method may not be possible.

As disclosed in the '735 application, the transceivers of the two (referred to as "sending" and "receiving") devices may be enabled to detect a link partner while dissipating minimal power. Link discovery may be implemented by the sending device (more particularly, the transmitter Tx portion of its transceiver) transmitting a beacon signal, periodically, for a short duration of time, instead of being enabled continuously. Likewise, the receiving device (more particularly, the receiver Rx portion of its transceiver) may be enabled to listen for the beacon, periodically, for a short duration of time, instead of being enabled continuously. A ratio of the transmit and receive durations of time can be established to ensure periodic overlap—i.e., that the receiver will be activated to detect the beacon within a reasonable number of periods. If a transmitter beacon is within an appropriate range to establish a link, the transmitter's beacon will be picked up by an active receiver. This periodic beaconing and listening approach allows for conservation of power (and extended battery life).

Some techniques for link detection, including beaconing and enumeration, and switching from reduced-power to full-power operation, are disclosed in the aforementioned U.S. 61/799,510, incorporated by reference herein. For example, as disclosed therein, a contactless connector chip may operate in a reduced-power state, low enough to allow for "always-on" operation, powering up only when a viable communications link with another contactless connector chip (which may similarly be operating in a reduced-power state) is detected, such as by beaconing or pinging. Upon detection, both devices may move to full-power operation, exchange capabilities and pairing codes, and the communications link may be enabled.

Electrostatic Shielding

As disclosed in the '735 application, one or both of the devices which are communicating with one another may be enclosed in a non-conducting barrier (housing, enclosure, or the like, not shown), such as of plastic or acrylic. Electromagnetic (EM) radiation may pass easily through the barrier, but electrical current cannot pass easily through the barrier. The barrier can therefore isolate circuit board and fragile chips from ESD (electrostatic discharge). The barrier may also hermetically seal the device(s). The barrier may additionally provide a benefit to device(s) such as cell phones, for example protecting them from moisture and humidity. The electromagnetic interface (EM) techniques disclosed herein may completely eliminate the need for any mechanical connectors (other than, perhaps a jack for recharging an internal battery) or other openings in the device.

Dielectric Coupler

As disclosed in the '735 application, the concept of providing a dielectric coupler to extend the range of the contactless link is described in the aforementioned U.S. 61/661,756 and U.S. Pat. No. 13/760,089.

Generally, a dielectric coupler for facilitating propagation of EHF-frequency signals may include an elongate strip of dielectric material (medium) such as plastic, glass, rubber or ceramic, and may have a rectangular cross section and two ends. Suitable plastic materials for the dielectric medium may include, but are not limited to, PE (polyethylene), acrylic, PVC (polyvinylchloride), ABS (Acrylonitrile-Butadiene-Styrene), and the like. The dielectric coupler may include dielectric portions made of plastic or other materials having a dielectric constant of at least about 2.0. Materials having higher dielectric constants may result in reduction of required dimensions due to a reduced wavelength of the signal in that material. The dielectric material of the plastic cable that may be at least partially coated in a layer having a low dielectric constant or an electrically conductive layer to facilitate propagation, reduce interference, or to reduce the likelihood of shorting the signal being propagated down a long axis of the coupler. The dielectric medium may function as a transmission medium (such as waveguide), and the EHF carrier may propagate along a long axis of the dielectric medium, maintaining a single polarization direction. An outer surface of the dielectric medium may be coated or covered with a conductive material (metal) which may isolate the dielectric medium from external interference (and, optionally, and may serve as a conductive path for electrical signals and/or power). Stacked or layered structures may enable multiple signal paths.

As noted in U.S. Pat. No. 13/776,727, incorporated in its entirety by reference herein, although the dielectric coupler may extend the range of the communication link, the primary mechanism at work is communicating EHF signals contactlessly with the first device over an anisotropic physical path through a dielectric medium Securing the Transmissions The point-to-point contactless links described herein are inherently secure. As disclosed in the '735 application, data passing between the two devices can further be secured (such as against "snooping") using a "technical" approach such as (but not limited to) the sending (source) device pausing (skipping) transmission of a data stream at periodic intervals, and allowing the receiving (destination) device to transmit "skip fills" back to the source device during the skipped periods. Further means for providing "shielding" of the transmissions (which may be considered to be a "physical" approach) to prevent against snooping are also described, such as disposing dielectric, plastic or other passive materials as a coating (or layer), or as a housing (or enclosure) around at least a portion of the data paths including the transceivers (Tx/Rx), the contactless link, and dielectric coupler (if any), to protect the data being transferred from being snooped, so that signals passing through the security coating (or housing) may become "muddled" by the composition or structure of the layer/housing, making any signals received outside the enclosure unintelligible. FIG. 4A of the '735 application shows devices communicating over a dielectric coupler which may be a plastic material selected for its ability to propagate EHF signals. An enclosure comprising a coating (or layer) of material may be disposed on (covering at least a portion of) the dielectric coupler, and may comprise dielectric, plastic or other passive materials capable of degrading an EHF signal emanating from the dielectric coupler and passing through the material. This "physical" approach to protecting against snooping, in addition with "technical" approaches such as skip fills (described above), encryption/decryption and the like, may provide enhanced security for data being transferred between two devices.

A Communications System with Devices having "Smart" Connectors

FIG. 1 illustrates a communications system 100 wherein two electronic devices 102 and 122 may communicate with one another over an associated contactless link 150. Data may be transferred in at least one direction, from a first device 102 which may be regarded as a "source" for sending the data to be transferred, to a second device 122 which may be regarded as a "destination" for receiving the data which is transferred. In the main hereinafter, the transfer of data from the first device 102 to the second device 122 may be described. However, it should be understood that data may alternatively or additionally be transferred from the second device 122 (acting as a "source" for sending the data) to the first device 102 (acting as a "destination" for receiving the data), and that often information may be exchanged in both directions between the two devices 102 and 122 during a given communications session.

For illustrative clarity, the two devices 102 and 122 will be described as "mirror images" of one another, but it should be understood that the two devices 102 and 122 may be different than each other. For example, one of the devices may be a laptop computer, the other device may be a mobile phone. Some examples of electronic devices which may benefit from the techniques disclosed herein may include cell phones (or handsets, or smart phones), computers, docks (docking stations), laptops, tablets, or comparable electronic device, to name but a few.

The first electronic device 102 may comprise a host system 104 and a communication subsystem (which may be referred to as "smart" contactless connector, or "smart connector", or "contactless connector", or simply "connector") 106. The connector 106 associated with the electronic device may be generally capable of performing at least one of:

establishing and managing operation of a contactless link 150 with the second device 122, monitoring and modifying data passing though the connector 106 onto the link 150, and interfacing with and providing application support for the host system 104.

These functions of the connector 106, with regard to interacting with the link 150, the data and the host system 104 may be described and elaborated upon and discussed in greater detail hereinbelow (or elsewhere in this disclosure).

The contactless connector 106 associated with the first device 102 may comprise some or all of the following elements:

an electrical interface 108
a processor 110 and associated memory 112
control circuits 114
measurement circuits 116
one or more transceivers 118.

The operation of these various elements (110-118) may be may be described and elaborated upon and discussed in greater detail hereinbelow (or elsewhere in this disclosure).

The second electronic device 122 may comprise a host system 124 and a communication subsystem (which may be referred to as "smart" contactless connector, or "smart connector", or "contactless connector", or simply "connector") 126. The connector 126 associated with the electronic device may be generally capable of :

establishing and managing operation of a contactless link 150 with the first device 102, monitoring and modifying data passing though the connector 126 onto the link 150, and interfacing with and providing application support for the host system 124.

These functions of the connector 126, with regard to interacting with the link 150, the data and the host system 124 may be described and elaborated upon and discussed in greater detail hereinbelow (or elsewhere in this disclosure).

The contactless connector 126 associated with the second device 122 may comprise some or all of the following elements:

an electrical interface 128
a processor 130 and associated memory 132
control circuits 134
measurement circuits 136
one or more transceivers 138.

The operation of these various elements (130-138) may be may be described and elaborated upon and discussed in greater detail hereinbelow (or elsewhere in this disclosure).

The connectors 106 and 126 may operate without intervention from the host processors (in the host systems 104 and 124, respectively), and may take control of the host system 104 and 124, respectively, or portions thereof.

The connectors 106 and 126 may open/activate applications, return status/power levels, connection parameters, data types, info on devices/systems that are connected, content info, amount of and type data being transferred, including device configuration based on connection type, link management, quota information, channel control, and the like.

The dashed-line rectangles shown (in the figure) around the connectors 106 and 126 may simply represent "partitioning" of functions, separating (distinguishing) the connectors 106 and 126 from the host system 104 and 124, respectively. The antennae shown (symbolically) outside of the dashed-line rectangles may be considered to be within the functional blocks of the connectors 106 and 126, but may be disposed either internal or external to a communications chip constituting the contactless connector.

The dashed-line rectangles shown (in the figure) around the connectors 106 and 126 may also represent non-conducting barrier (housing, enclosure, or the like, not shown), such as of plastic or acrylic enclosing the connectors 106 and 126 or the entire devices 102 and 122, respectively, as described hereinabove.

The electrical interfaces 108 and 128 may comprise communications port(s)/channel(s) to communicate with the host systems 104 and 124, respectively. The host systems 104 and 124 may have their own processors (not shown).

The processors 110 and 130 may be embedded microprocessors, or microcontrollers, or state machines, may run management OS for the connection, may have built-in authentication/encryption engines.

The processors 110 and 130, either alone or in combination with other elements presented herein, may be referred to as "means for managing the connection (or communications link)" or "means for monitoring data (passing through the connectors and over the communications link)", or "means for providing application support (for the host system)", or variations thereof as may become evident from the several functional descriptions set forth herein. Generally, all of the functions may be broadly characterized as "interactions" (with the link, with the data, with the host), and various elements and combinations thereof may be referred to as "means for interacting (with the link, data, host)". "Interacting" may include monitoring the link, the data or the host, as well as reacting to states or conditions of the link, data or host, as well as modifying the link/data/host. For example, one of more elements may constitute "means for determining the quality of the connection", or "means for determining the type of data passing through the connector (or over the link)", or "means for altering (or modifying or appending to) data passing through the connector", or "means for initiating actions in the host system", and the like. In some instances, some of these interactions may be performed primarily or exclusively by elements (electrical interfaces 108/128, memory 112/132, control circuits 114/134, measurement circuits 116/136, transceivers 118/138) other than the processors 110 and 130). The elements set forth herein may be considered to be any "means for performing" any of the functions set forth herein, whether described explicitly or implicitly. In a broader sense, the connectors 106, 126 are capable of performing one of more of (at least one of) the various functions described herein.

The memory 112 and 132 may be RAM (random access memory), NVRAM (non-volatile RAM), or the like, and may comprise registers containing configuration, status, permissions, content permissions, keys for authentication/encryption, and the like.

The control circuits 114 and 134 may comprise any suitable circuitry capable of (which may be referred to as "means for") monitoring the state of the link and/or actively appending to or changing data concurrently ("on-the-fly") as it goes through the contactless connector 106 or 126, respectively.

The measurement circuits 116 and 136 may comprise any suitable circuitry capable of observing (monitoring) the connection state/status, the connection type and the data being transmitted. Sensors (not shown) may be included to monitor signal strength, ambient environmental conditions, and the like. Signal-to-noise ratio can be used as an indicator of signal quality.

The transceivers 118 and 138 may comprise any transceivers (and associated transducers or antennas) suitable for converting between electrical signals (for the host system) and electromagnetic (EM) signals (for the contactless communications link), such as have been described hereinabove. The transceivers 118 and 138 may be referred to as "means for converting electrical signals to electromagnetic signals" (and variations thereof), and are described in greater detail hereinbelow. One or both of the connectors 106 or 126 may have two (or more) transceivers. Having two (or more) transceivers may support a feedback loop, latency, changes, full duplex operation, and simultaneously establishing a second communications link (such as for communicating with the host system).

An exemplary "data flow" may proceed as follows. Data originating from the host system 104 (or data originating at the first connector 106) may be provided by the first connector 106, via its transceiver 108, onto the communications link 150. The data passes through (or over) the communications link 150. Data received from the communications link 150 by the transceiver 138 of the second connector 128 may be provided to the host system 124 (or may remain in the second connector 126). Data may flow in the reverse direction, from the host system 124 via the connector 126 (or originating at the connector 126) onto the contactless link 150 to the connector 106 which may pass the data to the host system 104. The connectors 106 and 126 may be "contactless" connectors, and the communications link 150 may be a "contactless" link, as described hereinabove.

The communications link 150 may be a "contactless" link, and the first and second connectors 106 and 126 may be "contactless" connectors, as described herein. Differences between the contactless connectors 106 and 126 disclosed herein and conventional mechanical connectors may be immediately apparent, and may be described herein. The connectors may be considered to be communication subsystems of a host device. In this regard, differences between the contactless connectors 106 and 126 disclosed herein and controllers such as Ethernet (Standard) controllers may not be immediately apparent in that both may handle data flow between a host system and a communications link . However, a distinction between the contactless connectors (or subsystems) disclosed herein and exemplary Standards controllers is that the contactless connectors disclosed herein both set up the contactless communications link and transfer data from a host system directly onto the contactless communications link, without the intermediary (for example) of mechanical (electrical, not RF) connectors and a cable. Further distinctions may be made in the way that the contactless connectors disclosed herein are capable of operating independently and transparently from the host system, without requiring host awareness or interaction.

The Transceivers (118, 138) The transceivers 118 and 138 are examples of means for communicating EHF signals contactlessly between the first device 102 and the second device 122, respectively and for converting between EHF signals and digital electrical signals.

The transceivers 118 and 138 may each be a half-duplex transceiver which can asynchronously convert a baseband signal into a modulated EHF (extremely high frequency) carrier at 30-300 GHz, or higher, such as 60 GHz carrier frequency, which is radiated from an internal or external antenna (shown schematically only), or can receive and demodulate the carrier and reproduce the original baseband signal. The EHF carrier may penetrate a wide variety of commonly-used non-conductive materials (glass, plastic, etc.). Antennas associated with transceivers are discussed in detail in the '829 and '244 publications.

It should be understood that if only one-way communication is required, such as from the first device 102 to the second device 122, the transceiver 118 could be replaced by a transmitter (Tx) and the transceiver 138 could be replace by a receiver (Rx).

Transmit power and receive sensitivity for the transceivers 118 and 138 may be controlled to minimize EMI (electromagnetic interference) effects and simplify FCC certification. RF energy output by connectors 106 and 126 may be below FCC requirements for certification or for transmitting an identification (ID) code which would otherwise interrupt data flow during data transfers. Reference is made to 47 CFR §15.255 (Operation within the band 57-64 GHz), incorporated by reference herein.

The transceivers 118 and 138 may be implemented as IC chips comprising a transmitter (Tx), a receiver (Rx) and related components. The transceiver chip(s) may be packaged in a conventional manner, such as in BGA (ball grid array) format. The antenna may be integrated into the package, or may be external to the package, or may be incorporated onto the chip itself. An exemplary connector 106, 126 may comprise one, two, or more transceiver chips.

Some features or characteristics of the transceivers 118 and 138 may include:

Low latency signal path
Multi-Gigabit data rates
Link detection and link training The signals transmitted by the transceivers 118 and 138 may be modulated in any suitable manner to convey the data being transferred from one device to the other device, some non-limiting examples of which are presented herein. Modulation may be OOK (on/off keying) or other similar simple modulation techniques. Signals may be encoded and packetized and transmitted by one transceiver (such as 118), and received and unpacketized and decoded by another transceiver (such as 138). Out-of-band (OOB) signaling or other suitable techniques may be used to convey information other than or related to the data being transferred between the two devices.

The transceivers 118 and 138, or individual transmitters and receivers, which may be implemented as chips, may be factory-serialized, so that the chips and their transmissions may be 'tagged' (fingerprinted), which may enable a later forensic analysis to be performed for digital rights management (DRM). For example, protected (premium) content could be freely (unimpeded) transferred from one device to another, but the transaction could be traced to the specific devices involved, so that the participants in the transaction can be held accountable (such as, billed). Premium protected content may be modified, data appended thereto, and can be logged with chip ID, user ID, or by other means.

The Contactless Communications Link (150)

Data transfer between the two electronic devices 102 and 122 may be implemented over a "contactless" radio frequency (RF) electromagnetic (EM) communications link (interface) 150, which is handled substantially entirely by the "smart" connectors (communication subsystems) 106 and 126 of the first and second devices 102 and 122, respectively. Signals flowing between the devices 102 and 104 occurs electromagnetically over a non-electrical (dielectric) medium such as an air gap, waveguide, plastics (polyethylene, thermoplastic polymers, polyvinylidene difluoride, fluoropolymers, ABS, and other plastics), including combinations of these materials The EHF signal can pass through other dielectric materials such as cardboard. The EHF signal can pass through a series of different dielectric materials and/or waveguides.

Due to the high data rate enabled by the EHF contactless communication, large data files, such as movies, audio, device images, operating systems, and the like may be transferred in very short periods of time in contrast with existing technologies such as NFC. As an example, a 1 Gigabyte data file may be transferred in as little as 2 seconds.

The electromagnetic communication may typically be over an air gap may be limited to a short range, such as 0-5 cm. A dielectric medium such as a dielectric coupler, may be used to extend the range of the contactless link between the devices 102 and 104 to several centimeters (cm), meters, or more, and reference is made to the aforementioned U.S. 61/661,756 and U.S. Pat. No. 13/848,735.

The communications link may comprise a dielectric medium selected from the group consisting of air gap, waveguide, plastics, and combinations thereof. Alternatively, the communications link may be a slot antenna in a conductive medium, the slot antenna directing the contactless connectivity in a desired direction. A device (at least the contactless connector) may be substantially fully enclosed by a conductive medium other than at a location where it is desired to emit and receive EHF radiation from a partner device (at least the contactless connector thereof) which may also be similarly substantially fully enclosed by a conductive medium.

It should be understood that in this, and any other embodiments of contactless links discussed herein, an overall communications system may be implemented as a combination of contactless and physical links. Furthermore, some of the techniques described herein may be applied to transferring data over a physical link, such as a cable and connectors. Similarly, some of the techniques described herein may be applied to transferring data over a wireless link, such as WiFi or Bluetooth. In the main, hereinafter, the use of a contactless link for transferring data between the two devices will be described.

Initiating and Conducting a Communication Session

The establishment of a contactless communication link between devices 106 and 126 may be initiated by one or both of the devices.

1. One or both of the devices may be in power down, or idle mode states (beaconing may or may not be active)
2. An embedded processor, host processor, or application may initiate a transition from idle to active beaconing by writing a register/local memory or toggling a pin, or some other similar method
3. Two devices may discover each other as described above in the link discovery process
4. The embedded processors (or state machines) inside the smart connector may then optionally perform additional authentication of the link. This may include encrypted key exchange, using secret keys (known only to devices with the appropriate access) to encode data and information about the chips. This may also include manufacturer ID, device ID, and other codes that identify the device. If authentication passes, the embedded processor may optionally encrypt the link to prevent snooping. If authentication fails, the host devices may be notified of a failed (or unauthorized) communication attempt. The state machines may revert to idle or may disable the contactless communication link.
5. Once the link is up, the smart connector may monitor traffic (link operation) as is described below. An embedded processor, monitors (measurement circuits), and other circuitry within the contactless communication link may monitor the link, store information related to the link quality, and modify the link behavior based on the quality of the link.

The connectors 106 and 126, with embedded processors and embedded measurement and control circuits, are capable of interacting with the link, with the data being transferred over the link and with the host system of the devices in numerous ways, including (but not limited to):
  operating, including establishing, managing, monitoring, controlling, and directing link operation,
  examining, modifying, monitoring and altering data passing through the contactless connector,
  identifying the type of content being transferred, providing authentication and security services,
  interfacing with the host system and providing application support, These capabilities, alternatives and additional capabilities may be described in greater detail hereinbelow.

FIG. 2 is a diagram (in flowchart form) of a generalized exemplary overall method 200 of conducting a communications session between two electronic devices, such as the devices 102 and 122 described hereinabove, over a contactless link 150, such as has been described hereinabove. The method 200 may be described in a number of steps. In some cases, steps which are described are optional, and can be omitted. In other cases, the order in which the steps are presented may be changed. Some steps, described elsewhere, may not be shown in the diagram.

In an exemplary first step 202, both "smart" connectors 106 and 126, particularly their transceivers 118 and 138, respectively, may be operating in a reduced-power mode, awaiting link discovery, as described above. Upon discovery of the link, the "smart" connectors may power up and start negotiating the contactless connection, exchanging various parameters (such as those listed in other sections of this application) and information with one another as may be described elsewhere herein, and setting up the communication session. In addition, the connectors 106 and 126 can negotiate and set parameters based upon the type of connection—for example, device-to-device, device-to-docking station, device-to-cable - the parameters being set such that link signal integrity and FCC requirements are met. A "smart" connector may also negotiate and set these parameters based on the geographic location, the data rate of the connection, application requirements, whether the device is indoors or outdoors, and whether the device is within an aircraft.

In an exemplary next step 204, the communication session may commence. As discussed elsewhere, the session may begin using medium power settings, thereafter adjusting the power level to a more appropriate level, taking into consideration factors such as conserving battery power.

In an exemplary next step 206, measurements (monitoring) may be performed by one or both of the connectors 106 and 126, including (but not limited to) parameters such as: transmitted/received power, time-of-flight, parasitic loading, baseband data content/state, etc. Monitoring may be performed by the measurement circuits 116 and 136 of the connectors 106 and 126, respectively. This step can be performed before the step 204 of commencing the session.

In an exemplary next step 208, controls (adjusting) may be implemented by one or both of the connectors 106 and 126, including (but not limited to) parameters such as: transmitted carrier frequency and power, receiver tuning and sensitivity, signal path muting, enumeration states, power management, authentication, security, channel coding (On- Off Keying, Phase-Shift Keying, Frequency-Shift Keying, Amplitude-Shift Keying, Quadrature Amplitude Modulation, and other channel coding techniques), etc. Control may be implemented by the control circuits 114 and 134 of the connectors 106 and 126, respectively, or by the processors 110 and 130 of the connectors 106 and 126, respectively.

In an exemplary next step 210, application support (directing link operation) may be implemented by one or both of the connectors 106 and 126, including (but not limited to) detecting various characteristics of the communication session between two devices (and optionally notifying the host system of the associated device) such as, but not limited to: type of content being transferred, the type of connection, the type of devices or type of systems being connected, whether or not data will be transferred on demand or pushed into a device, which data is valid to be transferred, the prevention of DRM content being transferred, the prevention of other types of data being transferred, tracking data that is being transferred, appending info or changing (altering) data within a data stream, tracking and logging data transactions, etc. This may include the contactless connector tracking and logging characteristics of the contactless connection.

In an exemplary next step 212, various other tasks and techniques may be performed by one or both of the "smart" connectors, including (but not limited to) detecting the shape of the partner device, and other functions, such as may be discussed in greater detail herein.

In an exemplary next step 214, the devices my log off from the communications session, notify their respective host systems, and resume low-power operation awaiting discovery of a new link.

Some Capabilities of the "Smart Connectors"

Many capabilities may be enabled by "smart" connectors (with embedded processors) such as have been described herein establishing an "intelligent" communications link. By monitoring and controlling the communications link, as well as by providing application support, several advantages may be obtained. As mentioned previously, some of these techniques may be applicable to cabled connections, and also to wireless connections. Generally, however, the techniques described herein may be most beneficially adapted to contactless EHF connections established over an air gap or a dielectric coupler Some capabilities of or enabled by the "smart connectors" disclosed herein will be presented in three broad categories: "Managing the Link", "Modifying the Data", and "Providing Application Support". It should be understood that some of the capabilities presented in one category may involve capabilities being performed in another category or may be performed entirely in another category. Some capabilities that may not be neatly organized into these three broad categories may be discussed under the heading (in the category of) "Other Capabilities". The organization of capabilities into these categories is meant to be illustrative, not limiting.

Managing the Link

Managing the link 150 by the connectors 106 and 126 may include (but is not limited to):
  discovering, establishing and setting up the communications link (connection) between the two devices 102 and 104
  monitoring and reacting to the quality of the connection adjusting parameters
  and other functions, such as may be discussed in greater detail herein.

Since the connection is contactless, may be "short reach" (0-5 cm), and the devices 102 and 122 may move around with respect to one another, it may be advantageous for one or both of the "smart" connectors 106 and 126 to determine and monitor how much mechanical margin is present. (A given connector may determine link quality and react, and may notify its host, and can notify the other connector.) For example, the condition of the connection can be monitored, over time, and it can readily be determined whether the connection is improving or degrading. If it is determined that the connection is improving, appropriate actions such as increasing data rate or reducing power may be implemented. If it is determined that the connection is degrading, a time to connection failure may be calculated (estimated), and appropriate actions such as storing an indications of data transfer progress or smoothly shutting down the transceivers (or the host system, if it was woken up for the communication session) may be implemented, to name but a few actions that may be taken in response to link condition and history.

Conditions such as connection state can be determined, including factors such as time-of-flight, and used to verify proper connection, thereby providing security for the communication session. Vibrations can be detected, such as inferred by rapid small changes in position over time. This may be useful for detecting mechanical vibrations in engines, machinery or equipment, and only one connector may be needed to perform this function. Objects and obstacles can be detected. One device can detect the other device, and vice-versa. The proximity sensing capabilities of the connectors 106 and 126 enables the connectors to perform many "radar like" functions.

The time of flight or signal strength may be used as a hash into an encryption table. The key located at the hash indicated by the time of flight may be used to encrypt or decrypt the data as it travels over the link. In this manner, as the connection moves around or the signal is improved or degraded, the encryption code varies creating a virtually unhackable link.

The quality (state, condition, capability) of the communications link can determined (monitored, tested) by the "smart" connectors. This determination can be made at the beginning of a communications session, such in conjunction with link discovery, and can also be performed at any point, including continuously throughout the communication session. The quality of the link may be used to modify the data rate of transactions passing through the contactless communication link. As the quality degrades or improves, the data rate may change (be adapted) to ensure proper data integrity.

By monitoring the quality of the connection, it may be determined (predicted) for example that connection failure is imminent, in which case various actions as may be appropriate may be performed, such as exiting "smoothly" and/or notifying the host system of the imminent failure. (Some mechanical connectors use varying length traces to determine when a link is being unplugged, but these only provide a margin for power delivery, and are not able to alert an application that the data stream will be disconnected in a defined amount of time.)

The connectors 106 and 126 provide useful quality of service capability, such as linear connection strength telemetry, antenna loading, and other capabilities that are generally impossible with a conventional connector which fails catastrophically. These capabilities may be used to determine whether a link is being actively observed by a third party.

Upon discovery of a link, it may be determined that the link is weak, but improving. This may occur, for example, when one device is approaching the other. It may then be determined to wait, until the quality of the link has improved to a threshold level before conducting the communications session. Meanwhile, various actions can be taken by the connector (or by the host system, which may be notified by the connector) to prepare for the onset of the communications link. Then, the data that is being transferred may be transferred in an optimal manner, as quickly as possible, without tying up resources of either device for longer than necessary.

Information about the quality of the link may be passed on to the user of a device, such as via the host system, in which case it may be possible to allow the user to determine if or when a given data transfer should occur. The host system itself may decide whether and when to conduct the data transfer.

When a link is detected, the transceivers 118 and 128 can be powered up from their "always-on" reduced-power state. Initially, the link may be established using a high (such as maximum) power level, then dynamically decreased to a lower power level which is sufficient to maintain the link. Alternatively, the link may initially be established using a medium power level, thereafter increasing or decreasing the power level and determining the condition of the link, then dynamically decreased to a lower power level which is sufficient to maintain the link. Transceiver output may be dynamically controlled, for example to achieve at least one of minimizing power usage, maximizing data transfer rate, meeting emission requirements based on connection type, adjusting power output to improve quality of the connection, adjusting power output to provoke a reaction from the other contactless connector, and meeting emission requirements in different geographic locations Depending on what type of transaction (data transfer) is desired, transceiver power output may be adjusted accordingly. For example, a high power level may be used to ensure maximum data transfer rate.

Performance of the connectors 106 and 126 may be modified to maintain link integrity by adjusting power levels and tuning other parameters. Power usage may be reduced or minimized to conserve battery life, generate less heat, conserve other system resources, etc. Power levels may conversely be increased, to achieve other objectives. In general, the connectors 106 and 126 are capable of dynamically adapting to link conditions.

Sophisticated power management algorithms may be implemented, including (but not limited to) metering, quotas, speed/power scaling, multi-channel (carrier frequency) control, lock and key algorithms, and the like.

Modifying the Data

Modifying data passing through the connectors 106 and 126 to or from the link 150 may include (but is not limited to):

examining and modifying data passing though the connectors onto the link digital watermarking of data, as well as signature detection and stamping.

Steganography and obfuscation algorithms can be applied to data being transferred.

and other functions, such as may be discussed in greater detail herein.

Circuitry inside connector may perform the watermarking (including any modifying) of data passing though the connector based upon at least one of:

content of the data, such as its length, type, or source,

DRM (digital rights management) codes settings in the controller time of the transaction device information (such as manufacturer ID, user ID, etc.)

In this manner, data may be modified or secured as it is passing through the connector. Circuitry inside connector may also maintain a record or what data was sent over the link, when it was sent, DRM associated with the data, User ID, and the like.

The "smart" connector can identify the type of content being transferred over the communications link, provide application support (to the host system), and can modify what is being transferred based on a characteristic of the device at the other end of the link. Subsequent actions may be invoked based on content. As disclosed in U.S. Pat. No. 13/848,735, data may be transferred from a communication subsystem of a first device to a communication subsystem of a second device contactlessly, at high speed, and without intervention by host processors of either device.

The "smart" connectors disclosed herein may provide an additional level of security for data transfers, including (but not limited to) authentication, encryption, prevention of certain types of content being transferred, etc. Since the "smart" connector may be aware of the content in the data being transferred, it can identify and direct applications to be invoked in the host system. The transfer of certain types of data (non-authorized DRM content, viruses, OS, firmware, etc.) may be prevented. The "smart" connectors can determine what systems and devices are connected, their capabilities, whether they are the source of or destination for data, manage the devices, ascertain or modify device status, ascertain or modify connection status, limit the amount of data transferred, etc. Data being transferred can be tracked and logged, along with information on the data being transferred, transcryption, transactional coding of data, etc. The data being transferred can be modified, including tagged or encrypted.

Digital watermarking, signature detection/stamping and steganography/obfuscation algorithms may be applied to data being transferred over the connection. Connection-state (e.g. span) driven encryption may be employed. Telemetry data may be used to drive encryption. An extremely secure communication session can be conducted between two devices because only the two devices are privy to parameters such as signal strength, conditions which may be substantially impossible for a spying or snooping device to recreate. Threat detection, in the form of link qualification (proper timing, loading) may be implemented.

During setting up the session, a given device may enable different privilege levels, thereby facilitating or limiting data transfers depending on what the other device is and/or what privilege levels the other device has. The communication session may depend upon or otherwise be affected by the combination of the two devices engaged in the session.

Depending on the nature of the connection, as ascertained by the "smart" connector, the host system can modify parameters of or associated with the data being transferred, for example by increasing or decreasing bit error protection, and other characteristics of the data being transferred.

The "smart" connectors enable lock and key algorithms to be applied to data being transferred over the link.

Providing Application Support

Providing application support for the host system 104 and 124 by the connectors 106 and 126, respectively, may include (but is not limited to):

interfacing with the host system providing application support such as based on the type of connection or the type of content the connectors 106 and 126 can direct (handle, manage, manipulate) data, performing many of these (or similar) functions without host interaction.

perform power management, and aside from waking themselves up (moving from a low power state to a full power state), can also wake up the host system, if necessary storing register settings associated with the type of connection or type of content being sent over the connection providing interrupts to the host system based on the presence of a contactless connection or specific qualities of the contactless connection and other functions, such as may be discussed in greater detail herein.

An embedded processor or control circuitry within the "smart" connector (106, 126) may detect content passing through the connector, and based on appropriate settings within the connector may notify the host controller (in the host system 104, 124) and/or applications running on the host controller of specific content being transferred over the communications link (150), and may additionally provide bookkeeping and/or security services based upon requests from the host processor or application running on the host. For example, upon notification from the connector, the application running on the host may perform or prepare to perform tasks related to the content being transferred, which may include (but are not limited to):

displaying images, movies, playing audio files,
performing DRM,
obtaining digital rights from the cloud or verifying the DRM,
enabling interactive gaming between two devices
displaying information regarding the connection (and allowing the user to modify parameters),
displaying information regarding device(s), such as connecting with kiosk. For example, a device discovers a kiosk at the other end of the link, and notifies its host to launch a kiosk application. The content of data being transferred may be monitored and controlled, such as allowing only DRM-authorized content to be transferred. only device at the,
displaying a control console on the host device which allows the user to perform various tasks related to the data transfer, or only selected ones of possible tasks, depending upon permissions,
determining whether to transfer data, and what types of data are authorized to be transferred, and the data being transferred may be modified while it is (in conjunction with) being transferred,
limiting or preventing data of certain types from being transferred, based on permissions,
directing data (received during the transfer) to different memory locations in the host, depending on the type of data and security risks associated therewith. If the host is powered down, storing or retrieving data in or from memory locations within or outside of the connector.

The connector (106, 126) can identify itself to the host (104, 124) and expose certain functions through an API (application programming interface) or as a device or driver to the host processor or the connected device's host processor, allowing the host to exercise control over some functions of the connector. When two devices are communicating, one device can pass a device-specific API to the other device. When the API is passed, one device may be able to control or interface to the connected device through the API.

The connector may store information related to the contactless connection in registers associated with the connector. These registers may be accessible by the host processor and, based on these settings, applications may be initiated or closed, and functions (such as password access) within an application may be invoked. Based on the register settings received from the contactless connector, the host processor may determine how to treat/react to (such as store in certain memory locations) data being received via the contactless connector.

A given contactless connector (106) may collect, store and provide to its associated host system (104) information about the type of data being transferred over the communications link (150), information about the communications link itself and/or information or requirements that may be relevant to implementing an effective communication session between devices (102, 122) associated with the contactless connectors (106, 126), including tracking and logging characteristics of the contactless connection.

Many of the functions described herein may be implemented in an adapter/interface for a conventional mechanical connector for a cabled communications link.

Other Capabilities

Security of the communication is inherent in short-reach, point-to-point sessions, and certain "technical" and "physical" mechanisms for improving security have been discussed hereinabove. As disclosed in US 20120319496, the proximity of a nearby object may be detected, such as by a change in the effective impedance of an antenna caused by the nearby object. In this regard, a given contactless connector can determine an overall physical shape of a nearby object (which may be the partner device) and, based on the determined shape, certain privileges may be invoked or withheld. In a more general sense, the ability of a contactless connector such as described herein to "see" its surrounding environment, in a manner reminiscent of radar, numerous other possibilities may be enabled, based on the appearance of surrounding objects.

The contactless connector may detect position and movement (change in position, over time) of a nearby object, including another contactless connector, such as to initiate or validate a contactless connection. This may be used, for example, to recognize a particular object, such as by a particular movement relative to the contactless connector. The contactless connector (106) may further include an accelerometer (or gyroscope) to recognize changes in its own position, or how the device (102) it is associated with is moving, in three dimensions.

Contactless connectors such as disclosed herein have many inherent benefits over mechanical connectors. A given connector can support many different Standards, changing the protocol as may be necessary, without the problems of mechanical mismatch that is inherent in the variety of mechanical connectors supporting different Standards (including the variety of connectors that may be used within a given Standard). Information exchanged between devices during enumeration or bring-up may be used to choose different protocols (Standards), based on different needs—for example, transferring data using a USB protocol, transferring video using a video protocol, and the like—thereby enabling the pair of "smart" connectors to modify the way that they communicate (transfer data) with each other. The "smart" connectors may determine which protocol (Standard) to use based on (i) information about the connected device (type of device), (ii) detecting the type of data being transferred between devices, (iii) information about the link (such as signal strength, for example), (iv) any other information or requirements that may be relevant to implementing an effective communication session between connected devices.

The "smart" connectors described herein may provide seamless (transparent) authentication and security, autonomously, without involving the host system. Since much, if not all of the tasks are performed in the connector, the demands on the host system can greatly be alleviated. Various levels of security can be "layered" in the connection itself, between the two "smart" connectors. Scrambling and encryption can be based on the characteristics of the communications link itself, based on distance, other parameters, etc. For example, several layers of security may be implemented, including (but not limited to):

1) Because of the way EHF drops off with distance, it is only possible to snoop with a very noticeable apparatus in proximity to, and at just the right angle from the link, thus making such snooping attempts very obvious to the authorized user(s).
2) At more than a few centimeters from a full duplex link, any stray radiation from the upstream direction may be muddled in a non-deterministic way by radiation from the downstream link, thus obscuring the data content from the perspective of an unauthorized user.
3) Public-key encryption or other types of encryption could be applied to the signal, as described herein.

The "smart" connectors 106 and 126 enable link management, such as sophisticated power management algorithms, metering, quotas, speed/power scaling, and multi-channel (carrier frequency) control. Different connectors may operate at different frequencies. Frequency hopping may be employed. An optimal frequency for the connection-in-progress may be selected.

Some Advantages

Some advantages and benefits of the techniques disclosed herein may include, but are not limited to one or more of the following, including various combinations thereof:

data transfers may be extremely fast and may not require host interface for the data transfer
  the host processor may be OFF or in a low power state during transfers
  data may be transferred from unknown (un-trusted, such as lacking a security certificate) sources in a secure manner into a host device without the host device security or OS being compromised (the data may later be validated)
  data transfer can be effected through dielectrics, cardboard, packaging, etc.
  providing "technical" and "physical" protection(s) against snooping of data being transferred
  The connector(s) know what kind of connection is needed, and many different Standards can be supported.
  Protocols can be changed depending on what is needed
  mismatch of (mechanical) connectors becomes a non-issue. (adapters are not required)
  incompatible voltage levels inherent in physical links may be avoided
  transactions my be logged, such as for forensic analysis.
  DRM content can be controlled
  and other functions, such as may be discussed in greater detail herein.

While the invention(s) has been described with respect to a limited number of embodiments, these should not be construed as limitations on the scope of the invention(s), but rather as examples of some of the embodiments. Those skilled in the art may envision other possible variations, modifications, and implementations that should also be considered to be within the scope of the invention(s), based on the disclosure(s) set forth herein, and as may be claimed.

What is claimed is:

1. A method for controlling a contactless communications link existing between first and second contactless connectors, the method implemented in the first contactless connector, the method comprising;
   controlling operation of the contactless communications link, wherein the contactless communications link is actively and bi-directionally conveying contactless signals between the first and second contactless connectors, wherein the contactless signal transmitted by the first contactless connector is characterized by a power level;
   receiving connection strength telemetry indicative of the power level of the contactless signals being received by the second contactless connector;
   adjusting the power level of the contactless signals transmitted by the first connector based on the received connection strength telemetry
   using a first power level to establish the communications link; and
   after the communications link is established, adjusting the power level to one of a second power and a third power level, wherein the second power level is lower than the first power level and the third power level is greater than the first power level.

2. The method of claim 1, further comprising:
   predicting that a contactless communications link failure is imminent; and
   ceasing transmission of contactless signals in response to the predicted imminent communications link failure such that the transmission ceases before occurrence of the communications link failure.

3. The method of claim 1, further comprising:
   notifying a host system connected to the first contactless connector that the communications link failure is imminent.

4. The method of claim 1, further comprising:
   using a maximum power level to establish the contactless communications link;
   after the communications link is established, decreasing the power level of the contactless signal to a lower power level sufficient for maintaining the contactless communications link.

5. The method of claim 1, wherein the adjusting the power level comprises dynamically adjusting the power level to maximize a data transfer rate.

6. The method of claim 1, wherein the adjusting the power level comprises dynamically adjusting the power level to adhere to emission requirements of a particular geographic location.

7. The method of claim 1, wherein the adjusting the power level comprises dynamically adjusting the power level to improve quality of the contactless communications link.

8. The method of claim 1, wherein the adjusting the power level comprises dynamically adjusting the power level to minimize power consumption of the contactless connector.

9. A contactless connector for associating with an electronic device comprising a host system, the contactless connector establishes a contactless connection with another contactless connector associated with another electronic device by at least one of sending and receiving data in the form of extremely high frequency (EHF) signals over a contactless communications link, the contactless connector comprising:

an electrical interface for interfacing with the host system of the device;

a transceiver for contactlessly exchanging EHF signals with the other contactless connector according to a transceiver power output; and a processor operative to:
control operation of the contactless communications link, wherein the contactless communications link actively conveys contactless EHF signals between the transceiver and the other contactless connector;

monitor a quality of the active contactless communications link;

adjust the transceiver power output based on the monitored quality of the active contactless communications link;

instruct the transceiver to operate at a first transceiver output power level to establish the communications link; and after the communications link is established, adjust the transceiver output power level to one of a second transceiver output power level and a third transceiver output power level, wherein the second transceiver output power level is lower than the first transceiver output power level and the third transceiver output power level is greater than the first transceiver output power level.

10. The contactless connector of claim 9, wherein the quality of the active contactless communications link is based on connection strength telemetry indicative of the power level of the contactless EHF signals being received by the other contactless connector.

11. The contactless connector of claim 10, wherein the processor is operative to:
adjust the transceiver power output based on the connection strength telemetry.

12. The contactless connector of claim 9, wherein the quality of the active contactless communications link is based on antenna loading.

13. The contactless connector of claim 9, wherein the processor is operative to:
predict that a communications link failure is imminent; and
cease transmission of the contactless EHF signals in response to the predicted imminent communications link failure such that the transmission ceases before occurrence of the communications link failure.

14. The contactless connector of claim 13, wherein the processor is operative to inform the host system of the predicted imminent communication link failure.

15. The contactless connector of claim 9, wherein the processor is operative to:
use maximum transceiver output power to establish the communications link;
after the communications link is established, decrease transceiver output power to a lower power level sufficient for maintaining the contactless communications link.

16. The contactless connector of claim 9, wherein the processor is operative to dynamically adjust the transceiver output power to maximize a data transfer rate.

17. The contactless connector of claim 9, wherein the processor is operative to dynamically adjust the transceiver output power level to adhere to emission requirements of a particular geographic location.

18. A first device for contactlessly communicating with a second device, the first device comprising:
a contactless connector comprising a plurality of transceivers operative to contactlessly communicate with counterpart transceivers associated with the second device; and
a processor operative to:
control operation of a contactless communications link between the plurality of transceivers and the counterpart transceivers, wherein the communications link is actively and bi-directionally conveying contactless signals between the first and second devices, and wherein one of the plurality of transceivers is a transmitting transceiver operating at a transceiver output power;
receive connection strength telemetry indicative of the power level of the contactless signals being received at the second device, wherein one of the plurality of transceivers is a receiving transceiver that receives the connection strength telemetry from the second device;
adjust the transceiver output power of the transmitting transceiver based on the received connection strength telemetry;
instruct the transceiver to operate at a first transceiver output power level to establish the communications link; and
after the communications link is established, adjust the transceiver output power level to one of a second transceiver output power level and a third transceiver output power level, wherein the second transceiver output power level is lower than the first transceiver output power level and the third transceiver output power level is greater than the first transceiver output power level.

* * * * *